United States Patent
Hsiao et al.

(10) Patent No.: US 10,803,973 B2
(45) Date of Patent: *Oct. 13, 2020

(54) MEMORY MANAGEMENT METHOD AND STORAGE CONTROLLER

(71) Applicant: Shenzhen EpoStar Electronics Limited CO., Shenzhen (CN)

(72) Inventors: Yu-Hua Hsiao, Hsinchu County (TW); Chia-Wei Chang, Kaohsiung (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/679,295

(22) Filed: Nov. 11, 2019

(65) Prior Publication Data

US 2020/0075121 A1    Mar. 5, 2020

Related U.S. Application Data

(62) Division of application No. 16/175,860, filed on Oct. 31, 2018, now Pat. No. 10,515,712.

(30) Foreign Application Priority Data

Aug. 22, 2018 (TW) .............................. 107129324 A

(51) Int. Cl.
*G11C 29/52*       (2006.01)
*G11C 29/42*       (2006.01)
(Continued)

(52) U.S. Cl.
CPC .......... *G11C 29/52* (2013.01); *G11C 11/4087* (2013.01); *G11C 11/5628* (2013.01);
(Continued)

(58) Field of Classification Search
CPC . G11C 29/52; G11C 11/4087; G11C 11/5628; G11C 11/5642; G11C 29/42; H03M 7/16
(Continued)

(56) References Cited

U.S. PATENT DOCUMENTS 4,509,043 A * 4/1985 Mossaides ............... G09G 5/06
                                                                345/536
6,765,514 B2 * 7/2004 Chang ..................... H03M 7/16
                                                                341/50

(Continued)

*Primary Examiner* — Fernando Hidalgo
(74) *Attorney, Agent, or Firm* — JCIPRNET

(57) ABSTRACT

A memory management method and a storage controller using the same are provided. The method includes reading a target word-line to identify a plurality of raw Gray code indexes corresponding to a plurality of memory cells of the target word-line; performing a decoding operation on raw data of the target word-line to identify a plurality of decoded Gray code indexes corresponding to the memory cells; calculating a plurality of Gray code absolute bias values corresponding to the memory cells according to the raw Gray code indexes and the decoded Gray code indexes; and identifying one or more abnormal memory cells among the memory cells according to the Gray code absolute bias values; and recording the one or more abnormal memory cells into an abnormal memory cell table, wherein a Gray code absolute bias value of each of the one or more abnormal memory cells is greater than a bias threshold.

16 Claims, 9 Drawing Sheets

(51) Int. Cl.
*H03M 7/16* (2006.01)
*G11C 11/56* (2006.01)
*G11C 11/408* (2006.01)

(52) U.S. Cl.
CPC .......... *G11C 11/5642* (2013.01); *G11C 29/42* (2013.01); *H03M 7/16* (2013.01)

(58) Field of Classification Search
USPC .................................................. 365/185.18
See application file for complete search history.

(56) References Cited

U.S. PATENT DOCUMENTS 9,697,892 B1 * 7/2017 Varanasi ............. G11C 11/5635
2019/0006004 A1 * 1/2019 Shin .................... G11C 11/5628

* cited by examiner abnormal memory cell table

| | location of abnormal memory cell | total number of abnormal memory cells |
|---|---|---|
| WL1 | 1,4 | 2 |
| WL2 | 1,2 | 2 |
| ... | ... | ... |
| WN | 3,5,6 | 3 |

MEMORY MANAGEMENT METHOD AND STORAGE CONTROLLER

CROSS-REFERENCE TO RELATED APPLICATION

This application is a divisional of and claims the priority benefit of U.S. application Ser. No. 16/175,860, filed on Oct. 31, 2018, now allowed, which claims the priority benefit of Taiwan application serial no. 107129324, filed on Aug. 22, 2018. The entirety of each of the above-mentioned patent applications is hereby incorporated by reference herein and made a part of specification.

BACKGROUND OF THE DISCLOSURE

Field of the Disclosure

The disclosure relates to a memory management method, and particularly relates to a memory management method and a storage controller adapted for a storage device having a rewritable non-volatile memory module.

Description of Related Art

In general, a rewritable non-volatile memory module has a plurality of physical blocks. Each of the plurality of physical blocks has a plurality of memory cells, and the plurality of memory cells may form a plurality of word-lines (i.e., each physical block includes the plurality of word-lines). The plurality of memory cells in the rewritable non-volatile memory module may be damaged due to factors such as the number of times of use. As a result, one or more physical blocks may no longer be used. Traditionally, the controller of the rewritable non-volatile memory module detects or determines that the physical blocks that may no longer be used are bad physical blocks, and thus does not use the bad physical blocks to store data. However, not all the word-lines in each of the determined bad physical blocks are damaged. Accordingly, the overall available space of the rewritable non-volatile memory module is excessively reduced due to the determination of the bad physical blocks.

For example, assuming that a physical block is determined/marked as a bad physical block that may not store data by conventional methods, but a good word-line actually exists therein (no damaged word-line exits; data may be properly stored). In this case, the good word-line of the physical block may not be used simply because the physical block has already been determined/marked as the bad physical block. As a result, the good word-line of the physical block may not be used to store data, and the available space corresponding to the good word-line in the bad physical block is wasted.

Therefore, an important issue that needs to be addressed in the related field is how to more precisely determine whether a plurality of memory cells in a word-line of the rewritable non-volatile memory module are damaged (abnormal), and to further perform a corresponding subsequent management operation according to the result of determination, so that the problem of decoding errors caused by abnormal memory cells may be solved, and utilization efficiency of the available space of the rewritable non-volatile memory module may be improved.

SUMMARY OF THE DISCLOSURE

The disclosure provides a memory management method and a storage controller that perform a decoding operation on a word-line among a plurality of word-lines in a plurality of physical blocks of a rewritable non-volatile memory module in order to identify Gray code bias values of all of the memory cells in the word-line by comparing data before and after decoding. As a result, abnormal memory cells in the word-line may be efficiently identified by the use of the Gray code bias values.

An embodiment of the disclosure provides a memory management method adapted for a rewritable non-volatile memory module. Herein the rewritable non-volatile memory module has a plurality of word-lines, and each of the plurality of word-lines is composed of a plurality of memory cells, wherein each of the plurality of memory cells is configured to be programmed to store a bit value corresponding to one of a plurality of different Gray codes. The memory management method is provided hereinafter. A target word-line is read to obtain raw data, and a plurality of raw Gray code indexes corresponding to a plurality of memory cells of the target word-line are identified according to the raw data. A decoding operation is performed on the raw data to obtain decoded data, and a plurality of decoded Gray code indexes corresponding to the plurality of memory cells are identified according to the decoded data. A plurality of Gray code absolute bias values corresponding to the plurality of memory cells are calculated according to the plurality of raw Gray code indexes and the plurality of decoded Gray code indexes. One or more abnormal memory cells among the plurality of memory cells are identified according to the plurality of Gray code absolute bias values, and the one or more abnormal memory cells are recorded into an abnormal memory cell table. Herein a Gray code absolute bias value of each of the one or more abnormal memory cells is greater than a bias threshold.

An embodiment of the disclosure provides a storage controller configured to control a storage device having a rewritable non-volatile memory module. Herein the rewritable non-volatile memory module has a plurality of word-lines, and each of the plurality of word-lines is composed of a plurality of memory cells, wherein each of the plurality of memory cells is configured to be programmed to store a bit value corresponding to one of a plurality of different Gray codes. The storage controller includes a connection interface circuit, a memory interface control circuit, an error checking and correcting circuit, a word-line management circuit unit, and a processor. The connection interface circuit is configured to be coupled to a host system. The memory interface control circuit is configured to be coupled to the rewritable non-volatile memory module. The error checking and correcting circuit is configured to perform a decoding operation. The processor is coupled to the connection interface circuit, the memory interface control circuit, the error checking and correcting circuit and the word-line management circuit unit. Herein the processor is configured to instruct the memory interface control circuit to read a target word-line to obtain raw data, wherein the word-line management circuit unit is configured to identify a plurality of raw Gray code indexes corresponding to a plurality of memory cells of the target word-line according to the raw data. The processor is further configured to instruct the error checking and correcting circuit to perform the decoding operation on the raw data to obtain decoded data, wherein the word-line management circuit unit is further configured to identify a plurality of decoded Gray code indexes corresponding to the plurality of memory cells according to the decoded data. The word-line management circuit unit is further configured to calculate a plurality of Gray code absolute bias values corresponding to the plurality of memory cells according to the plurality of raw Gray code indexes and the plurality of decoded Gray code indexes. Herein the word-line management circuit unit is further configured to identify one or more abnormal memory cells among the plurality of memory cells according to the plurality of Gray code absolute bias values, and recording the one or more abnormal memory cells into an abnormal memory cell table, wherein a Gray code absolute bias value of each of the one or more abnormal memory cells is greater than a bias threshold.

Based on the foregoing description, in the memory management method and the storage controller provided by the embodiments of the disclosure, a word-line verification operation is performed on the rewritable non-volatile memory module of the storage device, so that the corresponding Gray code absolute bias values are obtained according to the raw bit values and the decoded bit values of the memory cells of the target word-line as read, and whether the target word-line has an abnormal memory cell or not is determined according to the plurality of Gray code absolute bias values. In this way, it is possible to effectively and precisely determine whether each memory cell of the word-lines of the rewritable non-volatile memory module is an abnormal memory cell, and to record the location of the abnormal memory cell. Accordingly, the storage controller may reduce the negative effects caused by the abnormal memory cells in the rewritable non-volatile memory module of the storage device, or, the storage controller may avoid using the word-line having too many abnormal memory cells so as to improve the overall performance efficiency of the storage device.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6B is a schematic view showing an abnormal memory cell table according to an embodiment of the disclosure.

DESCRIPTION OF THE EMBODIMENTS

In this embodiment, a storage device includes a rewritable non-volatile memory module and a storage device controller (a.k.a. a storage controller or a storage control circuit). Also, the storage device is usually used together with a host system so the host system may write data into or read data from the storage device.

Figure 1:
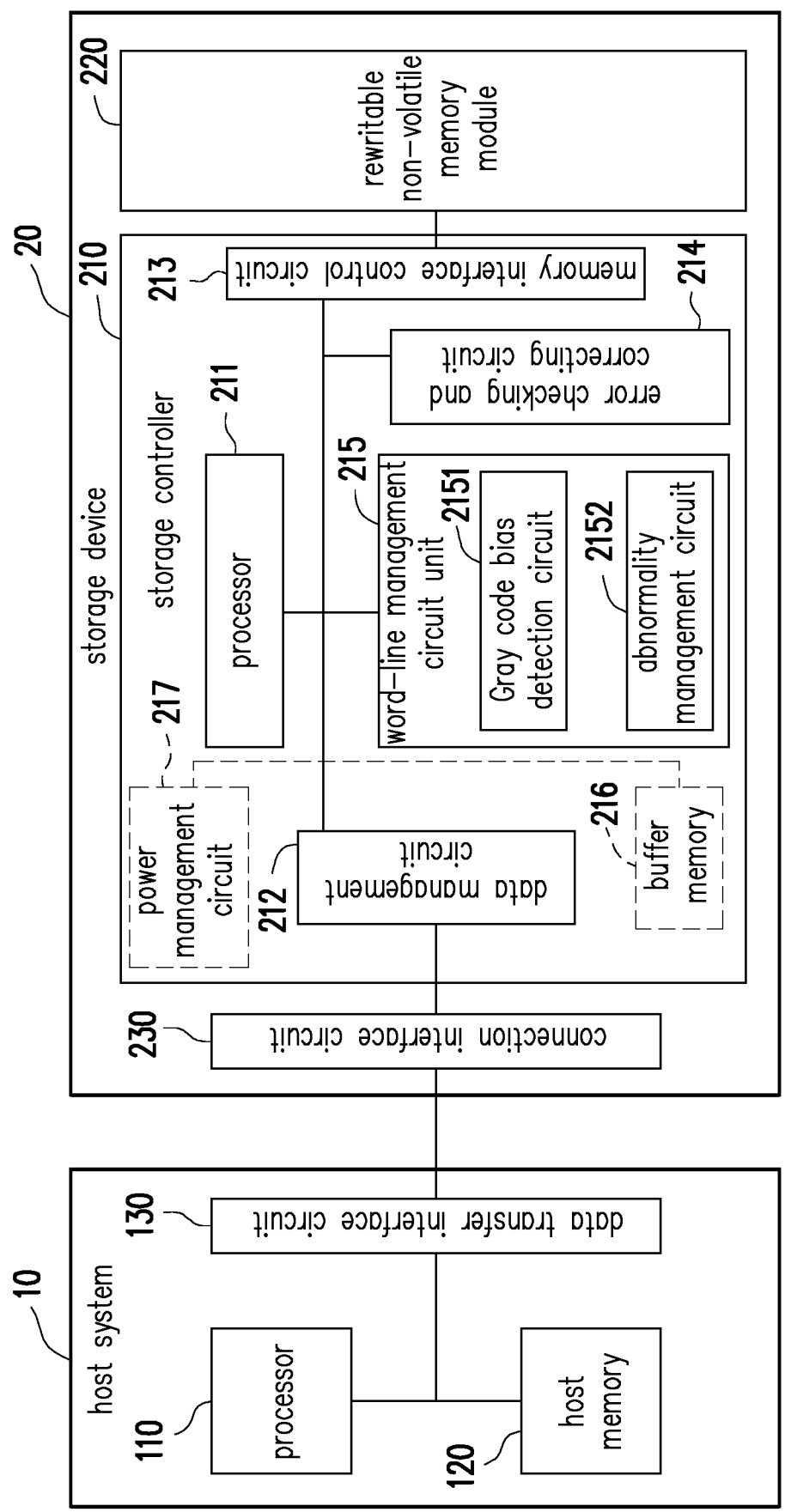
FIG. 1 is a block diagram showing a host system and a storage device according to an embodiment of the disclosure.

FIG. 1 is a block diagram showing a host system and a storage device according to an embodiment of the disclosure.

With reference to FIG. 1, a host system 10 includes a processor 110, a host memory 120 and a data transfer interface circuit 130. In this embodiment, the data transfer interface circuit 130 is coupled to (or, electrically connected to) the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 may store data to the storage device 20 or read data from the storage device 20 through the data transfer interface circuit 130.

In this embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In this embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the disclosure is not limited to the above. The data transfer interface circuit 130 and the connection interface circuit 230 may also be compatible to a PATA (Parallel Advanced Technology Attachment) standard, an IEEE (Institute of Electrical and Electronic Engineers) 1394 standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in this exemplary embodiment, the host memory 120 may be a DRAM (Dynamic Random Access Memory), or a SRAM (Static Random Access Memory) and the like. Nevertheless, it should be understood that the disclosure is not limited in this regard, and the host memory 120 may also be other appropriate memories. However, it should be understood that the disclosure is not limited thereto, and the host memory 120 may also be other suitable memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data when the storage device 20 is in operation.

It should be noted that, in the embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements. The disclosure is not limited in this regard.

In an embodiment, the storage controller 210 further includes a ROM (not illustrated) and a RAM (not illustrated). More particularly, the ROM has a boot code, which is executed by the processor 221 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area (for example, physical storage units in the rewritable non-volatile memory module 220 dedicated for storing system data) of the rewritable non-volatile memory module 220.

In this embodiment, as described above, the storage controller 210 further includes the data management circuit 212 and the memory interface control circuit 213. It should be noted that, operations performed by each part of the storage controller 210 may also be considered as operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to the write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a reading operation performed according to a read command from the host system 10). In another embodiment, the data management circuit 212 may also be integrated into the processor 211.

The memory interface control circuit 213 is configured to perform the writing (or, programming) operation, the reading operation and the erasing operation for the rewritable non-volatile memory module 220 together with the data management circuit 212 under instruction of the processor 211.

For instance, the processor 211 may execute a write command sequence to instruct the memory interface control circuit 213 to write the data into the rewritable non-volatile memory module 220; the processor 211 may execute a read command sequence to instruct the memory interface control circuit 213 to read the data from one or more physical units corresponding to the read command in the rewritable non-volatile memory module 220; the processor 211 may execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding writing, reading and erasing operations on the rewritable non-volatile memory module 220. In an embodiment, the processor 211 may also give other types of command sequences to the memory interface control circuit 213, so as to perform the corresponding operation on the rewritable non-volatile memory module 220.

In addition, data to be written to the rewritable non-volatile memory module 220 is converted into a format acceptable by the rewritable non-volatile memory module 220 through the memory interface control circuit 213. More specifically, if the processor 211 is to access the rewritable non-volatile memory module 220, the processor 211 transmits the corresponding command sequence to the memory interface control circuit 213, so as to instruct the memory interface control circuit 213 to execute the corresponding operation. For example, the command sequences may include the writing command sequence for instructing to write data, the reading command sequence for instructing to read data, the erasing command sequence for instructing to erase data, and corresponding command sequences for instructing to execute various memory operations (e.g., change a plurality of preset read voltage values of a preset read voltage group to perform a read operation, or execute a garbage collection process). The command sequences may include one or more signals or data on the bus. The signals or data may include command codes or program codes. For example, the reading command sequence includes information, such as identification code and memory address, of the reading.

The rewritable non-volatile memory module 220 is coupled to the storage controller 210 (the memory control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module, other flash memory modules or any memory module having the same features. The memory cells in the rewritable non-volatile memory module 220 are disposed in an array.

In this embodiment, the rewritable non-volatile memory module 220 has a plurality of word-lines, wherein each word-line among the word-lines includes a plurality of memory cells. The memory cells on the same word-line constitute one or more physical programming units (physical pages). In addition, a plurality of physical programming units may constitute one physical unit (a physical block or a physical erasing unit).

The storage controller 210 assigns a plurality of logical units for the rewritable non-volatile memory module 220. The host system 10 accesses user data stored in a plurality of physical units through the assigned logical units. Here, each of the logical units may be composed of one or more logical addresses. For example, the logical unit may be a logical block, a logical page, or a logical sector. Each logical unit may be mapped to one or more physical units, wherein the physical unit may be one or more physical addresses, one or more physical sectors, one or more physical programming units, or one or more physical erasing units. In this embodiment, the logical unit is a logical block, and the logical sub-unit is a logical page. Each logical unit includes a plurality of logical sub-units. In this embodiment, the address of the logical sub-unit is also known as a logical address.

Besides, the storage controller 210 would create a logical to physical address mapping table and a physical to logical address mapping table for recording a mapping relation between the logical units (e.g., the logical blocks, the logical pages or the logical sectors) assigned to the rewritable non-volatile memory module 220 and the physical units (e.g., the physical erasing units, the physical programming units or the physical sectors). In other words, the storage controller 210 can look up for the physical unit mapped to one logical unit by using the logical to physical address mapping table, and the storage controller 210 can look up for the logical unit mapped to one physical unit by using the physical to logical address mapping table. Nonetheless, the technical concept for the mapping relation between the logical units and the physical units is a well-known technical means in the field, which is not repeated hereinafter. In the general operation of the storage controller, the logical to physical address mapping table and the physical to logical address mapping table may be maintained in a buffer memory 216.

In this embodiment, an error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command (also known as an encoding operation), and the processor 211 writes data corresponding to the write command and the corresponding ECC and/or the EDC into the rewritable non-volatile memory module 220. Then, when the processor 211 reads the data from the rewritable non-volatile memory module 220, the ECC and/or the EDC corresponding to the data are also read, and the error checking and correcting circuit 214 performs the error checking and correcting procedure on the read data based on the ECC and/or the EDC (also known as a decoding operation), so that the correct decoded data and the corresponding error bits value are obtained after the decoding operation is successfully completed.

In an embodiment, the storage controller 210 further includes a buffer memory 216 and a power management circuit 217. The buffer memory 216 is coupled to the processor 211 and configured to temporarily store data and commands from the host system 10, data from the rewritable non-volatile memory module 220 or other system data for managing the storage device 20, so that the processor 211 can rapidly access the data, the command or the system data from the buffer memory 216. The power management circuit 217 is coupled to the processor 211 and configured to control power of the storage device 20.

In this embodiment, a word-line management circuit unit 215 includes a Gray code bias detection circuit 2151 and an abnormality management circuit 2152. The word-line management circuit unit 215 is used to implement the memory management method (also known as a word-line verification method) provided by this embodiment. It should be noted that, in an embodiment, the word-line management circuit unit 215 may also be integrated into the processor 211, so that the processor 211 may implement the memory management method provided by this embodiment. Besides, in another embodiment, the word-line management circuit unit 215 may also be implemented as a word-line management circuit unit module by firmware or software and be accessed and executed by the processor 211 so as to implement the memory management method provided by the disclosure.

In this embodiment, a memory cell short phenomenon or a memory cell open (or memory cell broken) phenomenon may occur between the adjacent memory cells of two or more adjacent word-lines among the plurality of word-lines of the rewritable non-volatile memory module 220.

For example, if a memory cell short phenomenon occurs in a memory cell of a word-line (also known as an abnormal memory cell), the threshold voltage of the corresponding stored bit value of the abnormal memory cell is affected by the programming voltage applied to the adjacent memory cell (the memory cell having a short phenomenon) so as to cause an error in the stored bit value. For another example, if a memory cell open (or memory cell broken) phenomenon occurs in a memory cell (also known as an abnormal memory cell) of a word-line, the threshold voltage of the abnormal memory cell may not be correctly programmed by the programming voltage expected to be applied so as to cause an error in the stored bit value. In other words, both of these two kinds of abnormal memory cells cause errors in the stored bit values (data). When the number of abnormal memory cells of a word-line increases, the number of error bits of the data stored in the word-line is also increased. Accordingly, the memory management method and the corresponding word-line management circuit unit 215 provided by this embodiment may determine whether each word-line has an abnormal memory cell, and identify (and record) the location and the total number of the determined abnormal memory cells. The memory management method and the corresponding word-line management circuit unit 215 provided by this embodiment are described in detail hereinafter with reference to FIG. 2.

Figure 2:
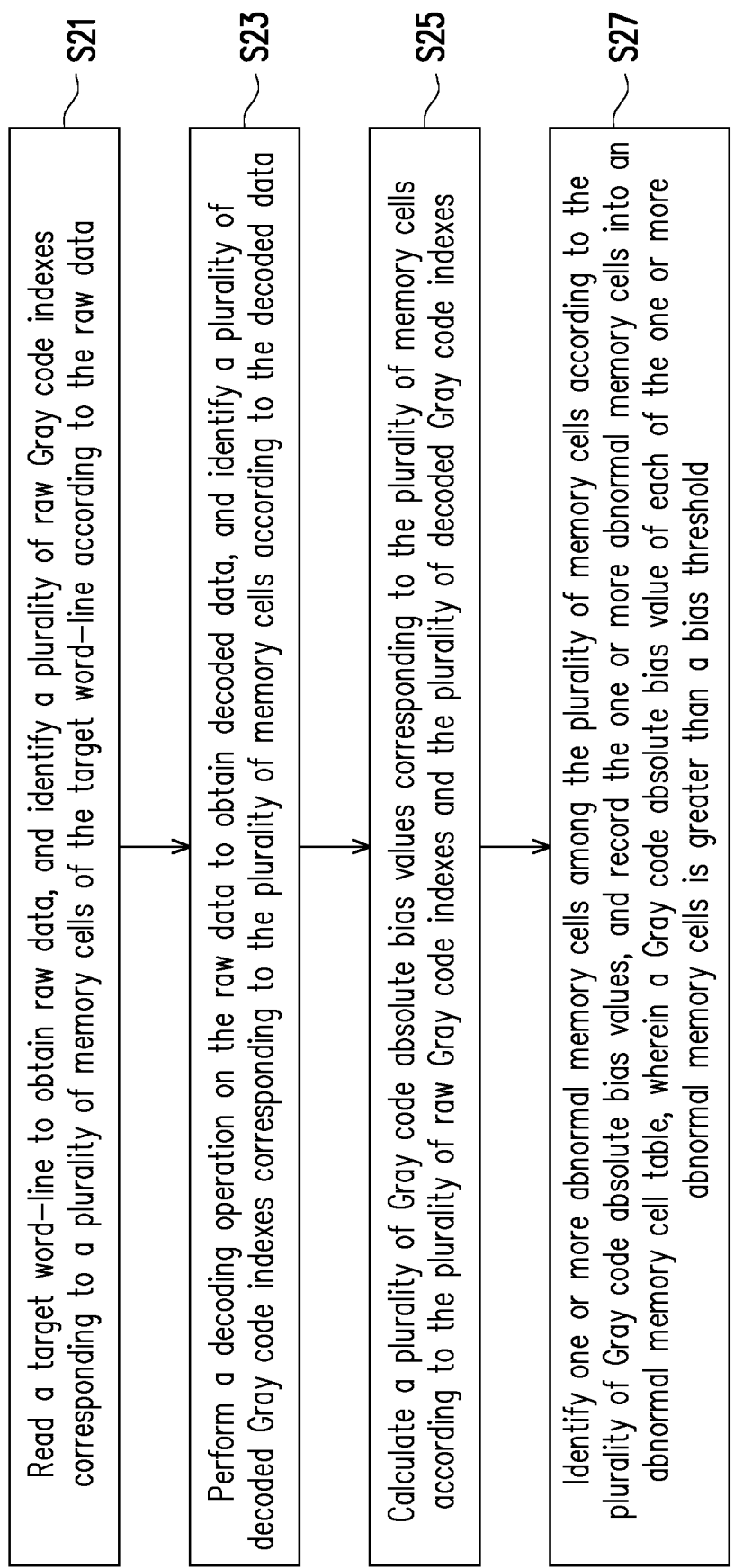
FIG. 2 is a flowchart showing a memory management method according to an embodiment of the disclosure.

FIG. 2 is a flowchart showing a memory management method according to an embodiment of the disclosure. With reference to FIG. 2, in step S21, the processor 211 instructs the memory interface control circuit 213 to read the target word-line to obtain raw data, and the word-line management circuit unit 215 (or the Gray code bias detection circuit 2151) identifies a plurality of raw Gray code indexes corresponding to a plurality of memory cells of the target word-line according to the raw data.

Specifically, in this embodiment, the processor 211 may select one of the plurality of word-lines (also known as a target word-line) of the rewritable non-volatile memory module 220 at a specific time point to execute a word-line verification operation. The specific time point is, for example, one of the following time points or a combination thereof: (1) when the data is read from the target word-line and there is no record of the corresponding target word-line in the abnormal memory cell table; (2) when the storage device 20 is idle; (3) when the number of error bits of the target word-line is greater than an error bit threshold; (4) when the average erase count corresponding to all the physical blocks of the storage device 20 reaches a multiple of one verification number parameter to set all the word-lines storing the data as the target word-lines and to execute the word-line verification operation one by one; (5) when the erase count (or the writing count) of the target word-lines reaches a multiple of one verification number parameter. It should be noted that the selected target word-lines are word-lines already stored with data.

In this embodiment, the target word-line as described above is stored with data. Specifically, the plurality of memory cells of each word-line of the rewritable non-volatile memory module 220 are configured to be programmed to store a bit value corresponding to one of a plurality of different Gray codes, and the total number of the Gray codes is N. The value of N is determined based on the total number (M) of bits that may be stored in each memory cell of the rewritable non-volatile memory module 220. N is the M-th power of 2. For example, if the rewritable non-volatile memory module 220 is TLC (i.e., M is equal to 3), then N=8. If the rewritable non-volatile memory module 220 is MLC (i.e., M is equal to 2), then N=4. If the rewritable non-volatile memory module 220 is SLC (i.e., M is equal to 1), then N=2. If the rewritable non-volatile memory module 220 is QLC (i.e., M is equal to 4), then N=16. The Gray codes and the corresponding Gray code indexes described in this embodiment are described in detail hereinafter with reference to FIG. 3.

Figure 3:
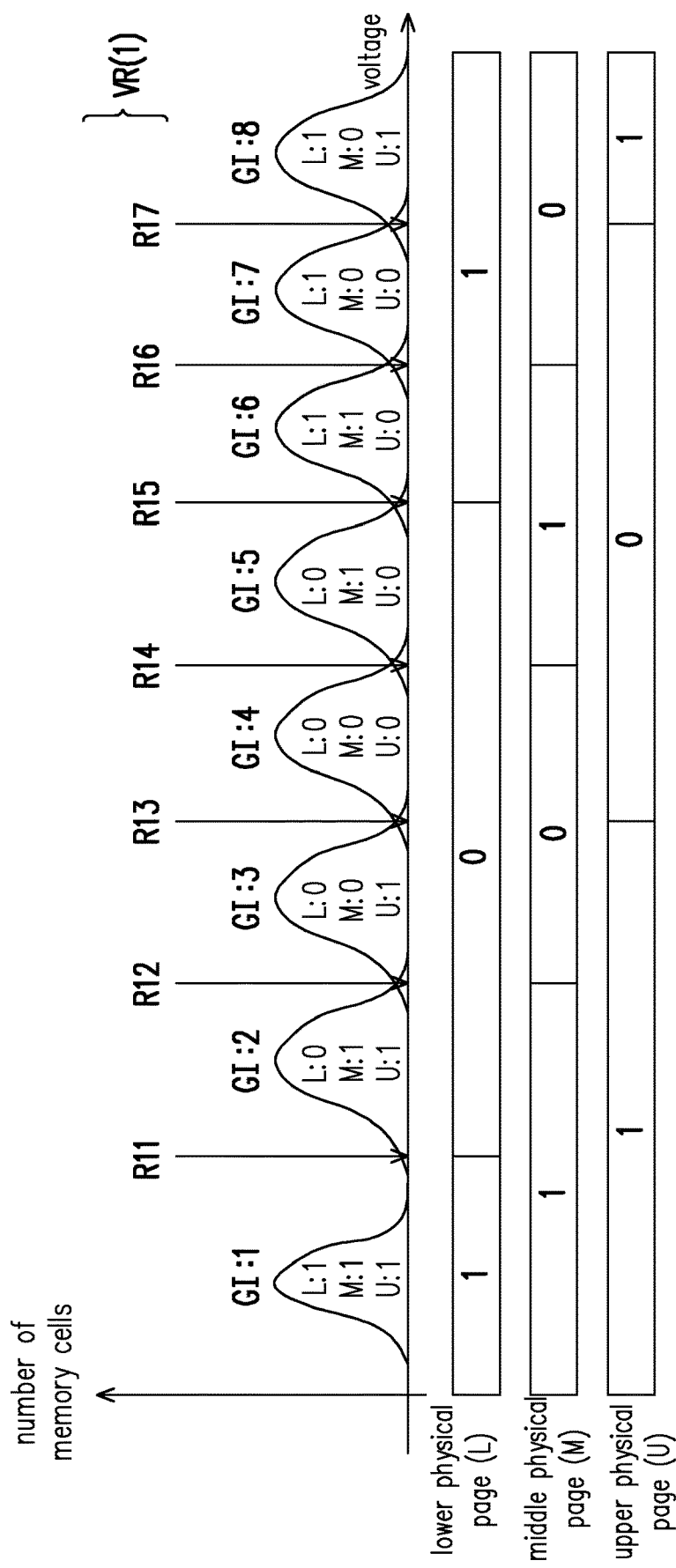
FIG. 3 is a schematic view showing Gray codes and corresponding Gray code indexes according to an embodiment of the disclosure.

FIG. 3 is a schematic view showing Gray codes and corresponding Gray code indexes according to an embodiment of the disclosure. With reference to FIG. 3, a triple level cell (TLC) NAND flash memory module is used as an example in this embodiment, wherein N is equal to 8 (i.e., $2^3$). Each memory cell of the TLC NAND flash memory module has three physical pages for storing bit data respectively, and each memory cell includes a lower physical page (L), a middle physical page (M) and an upper physical page (U) that may each store a bit value. It is assumed that the processor 211 reads a plurality of memory cells (a plurality of target memory cells) of the target word-line of the TLC NAND flash memory module via the plurality of read voltages R11-R17 of a first read voltage group VR(1), and thereby identifies different bit values (corresponding to bit values of different Gray codes respectively) stored in the plurality of memory cells. The gate voltage in each memory cell may be divided into eight kinds of Gray codes according to the read voltages R11-R17 in the first read voltage group, such as "L:1 M:1 U:1", "L:0 M:1 U:1", "L:0 M:0 U:1", "L:0 M:0 U:0", "L:0 M:1 U:0", "L:1 M:1 U:0", "L:1 M:0 U:0" and "L:1 M:0 U:1" ("L:" indicates the bit value of the lower physical page; "M:" indicates the bit value of the middle physical page; "U:" indicates the bit value of the upper physical page). The eight kinds of Gray codes may also expressed as eight kinds of bit value combinations, that is, "111", "011", "001", "000", "010", "110", "100" and "101". Herein the ordering of the bit values in each of the bit value combinations is based on the sequence of the lower, middle and upper physical pages. In other words, by applying the read voltages R11-R17 of the different voltage values of the first read voltage group VR(1) respectively to a memory cell of the target word-line, the processor 211 may determine whether the channel of the memory cell is turned on so as to determine the bit value (also known as bit data or read bit value) stored in the memory cell as corresponding to one of the different Gray codes ("111", "011", "001", "000", "010", "110", "100" or "101") (that is, reading a read bit value from one memory cell of the target word-line by using the first read voltage group VR(1)). For example, the read voltage R11 may distinguish the Gray code "111" from the Gray code "011" (the left of the read voltage R11 is the threshold voltage distribution corresponding to the Gray code "111"; the right of the read voltage R11 is the threshold voltage distribution corresponding to the Gray code "011").

In this embodiment, a plurality of Gray code indexes GI are respectively assigned to the plurality of Gray codes. For example, based on the sizes of the threshold voltage distributions corresponding to the plurality of Gray codes, the Gray code indexes GI may be arranged in a sequence from small quantity to large quantity (also known as a first order). Herein the absolute difference value between two adjacent Gray code indexes GI is 1. That is, as shown in FIG. 3, the Gray code index GI of the Gray code "111" is "1"; the Gray code index GI of Gray code "011" is "2"; the Gray code index GI of Gray code "001" is "3"; the Gray code index GI of Gray code "000" is "4"; the Gray code index GI of Gray code "010" is "5"; the Gray code index GI of Gray code "110" is "6"; the Gray code index GI of Gray code "100" is "7"; the Gray code index GI of Gray code "101" is "8". However, the setting of the Gray code indexes of the disclosure is not limited to the above manner. For example, in another embodiment, based on the sizes of the threshold voltage distributions corresponding to the plurality of Gray codes, the Gray code indexes GI may be arranged in a sequence from large quantity to small quantity (also known as a second order). Besides, in still another embodiment, the Gray code indexes are arranged according to the first order, and the absolute difference value between adjacent Gray code indexes is set to be a positive integer greater than one.

Referring back to FIG. 2, after the raw data/channel data is obtained by reading the target word-line, the word-line management circuit unit 215 (or the Gray code bias detection circuit 2151) may identify the Gray codes stored in the plurality of memory cells of the target word-line (also known as the raw Gray codes) according to a plurality of raw bit values of the raw data, and thereby identify the corresponding Gray code indexes (also known as the raw Gray code indexes). It should be noted that since a decoding operation has not been performed on the raw data, the correctness of the plurality of raw bit values of the raw data may not be guaranteed.

Figure 4:
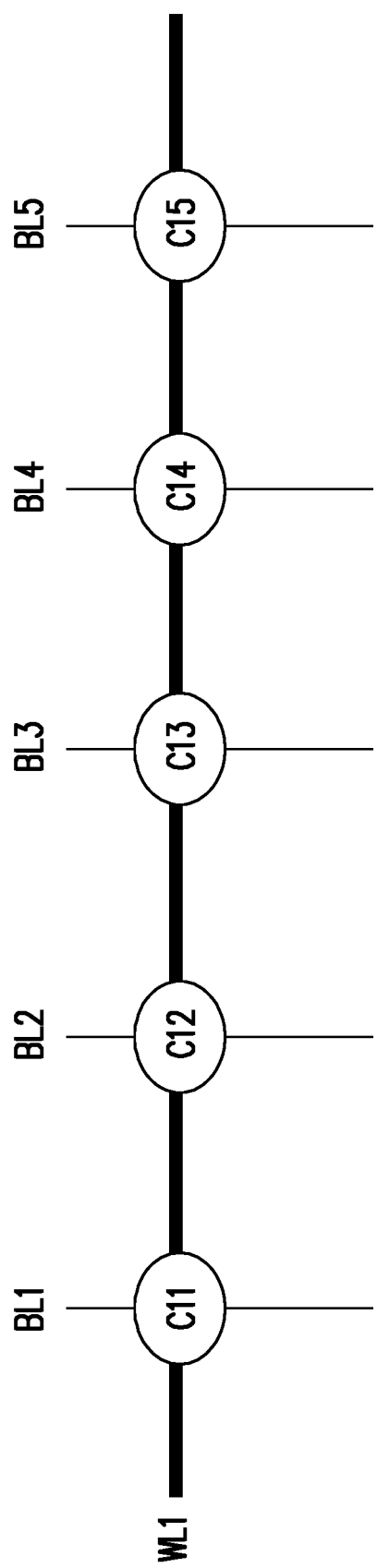
FIG. 4 is a schematic view showing a word-line according to an embodiment of the disclosure.
Figure 5:
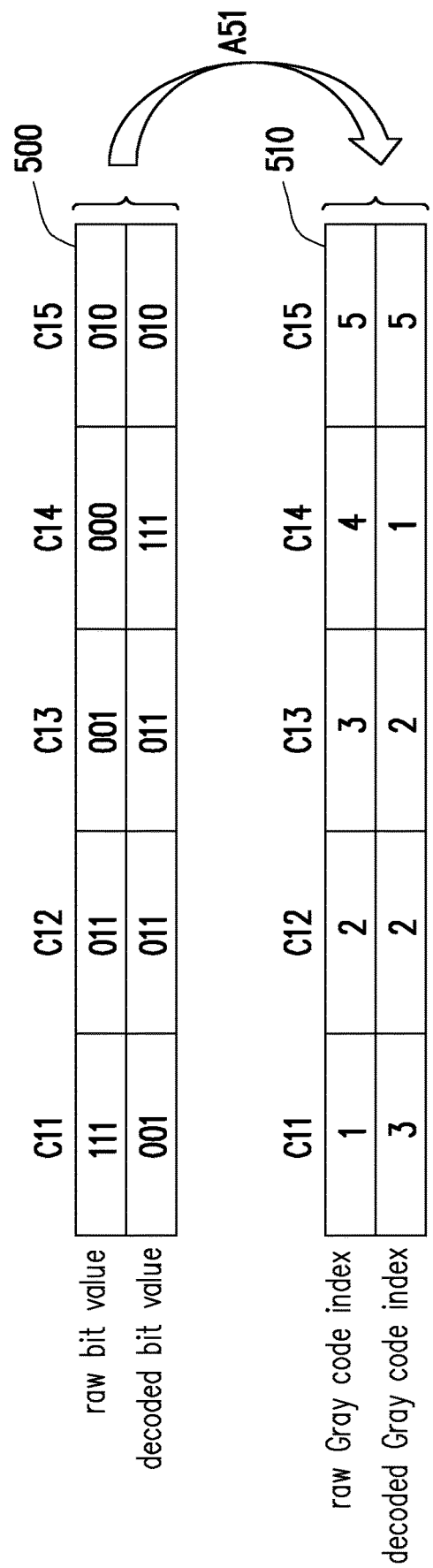
FIG. 5 is a schematic view showing how to identify Gray code indexes according to an embodiment of the disclosure.

Next, in step S23, the processor 211 instructs the error checking and correcting circuit 214 to perform a decoding operation on the raw data via an error checking and correcting code corresponding to the raw data, thereby obtaining decoded data. The word-line management circuit unit 215 (or the Gray code bias detection circuit 2151) identifies a plurality of decoded Gray code indexes corresponding to the plurality of memory cells according to the decoded data. Specifically, after obtaining the raw data, the processor 211 instructs the error checking and correcting circuit 214 to perform a decoding operation on the raw data so as to obtain the decoded data after the decoding operation is successfully performed. A plurality of decoded bit values in the decoded data would then be correct data. Similar to step S21, the word-line management circuit unit 215 (or the Gray code bias detection circuit 2151) may identify the Gray codes stored in the plurality of memory cells of the target word-line (also known as the decoded Gray codes) according to the plurality of decoded bit values of the decoded data, and thereby identify the corresponding Gray code indexes (also known as the decoded Gray code indexes). FIG. 4 and FIG. 5 are used for illustration in the following.

FIG. 4 is a schematic view showing a word-line according to an embodiment of the disclosure. FIG. 5 is a schematic view showing how to identify Gray code indexes according to an embodiment of the disclosure.

For example, with reference to FIG. 4, it is assumed that there are a plurality of memory cells C11-C15 on a target word-line WL1. Herein the plurality of memory cells C11-C15 are respectively located at the intersections between the word-line WL1 and bit lines BL1-BL5. When the read voltage is applied to read the target word-line WL1, the raw Gray codes corresponding to the raw bit values stored in the plurality of memory cells C11-C15 and the raw Gray code indexes corresponding to the plurality of raw Gray codes are then identified. Besides, after the decoding operation is performed, the decoded Gray codes corresponding to the decoded bit values of the decoded data stored in the plurality of memory cells C11-C15 and the decoded Gray code indexes corresponding to the decoded Gray codes are then identified.

With reference to FIG. 5, it is assumed that the plurality of raw Gray codes corresponding to the plurality of raw bit values of the memory cells C11-C15 are "111", "011", "001", "000" and "010" respectively, and that the plurality of decoded Gray codes corresponding to the plurality of decoded bit values of the memory cells C11-C15 are "011", "011", "011", "111" and "010" respectively (as shown in Table 500). The word-line management circuit unit 215 (or the Gray code bias detection circuit 2151) may identify (as shown by arrow A51) a plurality of raw Gray code indexes "1", "2", "3", "4" and "5" corresponding to the memory cells C11-C15, and may identify a plurality of decoded Gray code indexes "3", "2", "2", "1" and "5" corresponding to the memory cells C11-C15 (as shown in Table 510).

Referring back to FIG. 2, next, in step S25, the word-line management circuit unit 215 (or the Gray code bias detection circuit 2151) calculates a plurality of Gray code absolute bias values corresponding to the memory cells according to the raw Gray code indexes and the decoded Gray code indexes. Specifically, the word-line management circuit unit 215 (or the Gray code bias detection circuit 2151) uses the absolute difference values between the plurality of raw Gray code indexes and the plurality of decoded Gray code indexes as the plurality of Gray code absolute bias values. For example, the word-line management circuit unit 215 (or the Gray code bias detection circuit 2151) uses the absolute value of the difference value obtained by subtracting the decoded Gray code index of the memory cell from the raw Gray code index of the memory cell as the Gray code absolute bias value of the memory cell. For another example, the word-line management circuit unit 215 (or the Gray code bias detection circuit 2151) uses the absolute value of the difference value obtained by subtracting the raw Gray code index of the memory cell from the decoded Gray code index of the memory cell as the Gray code absolute bias value of the memory cell.

Figure 6A:
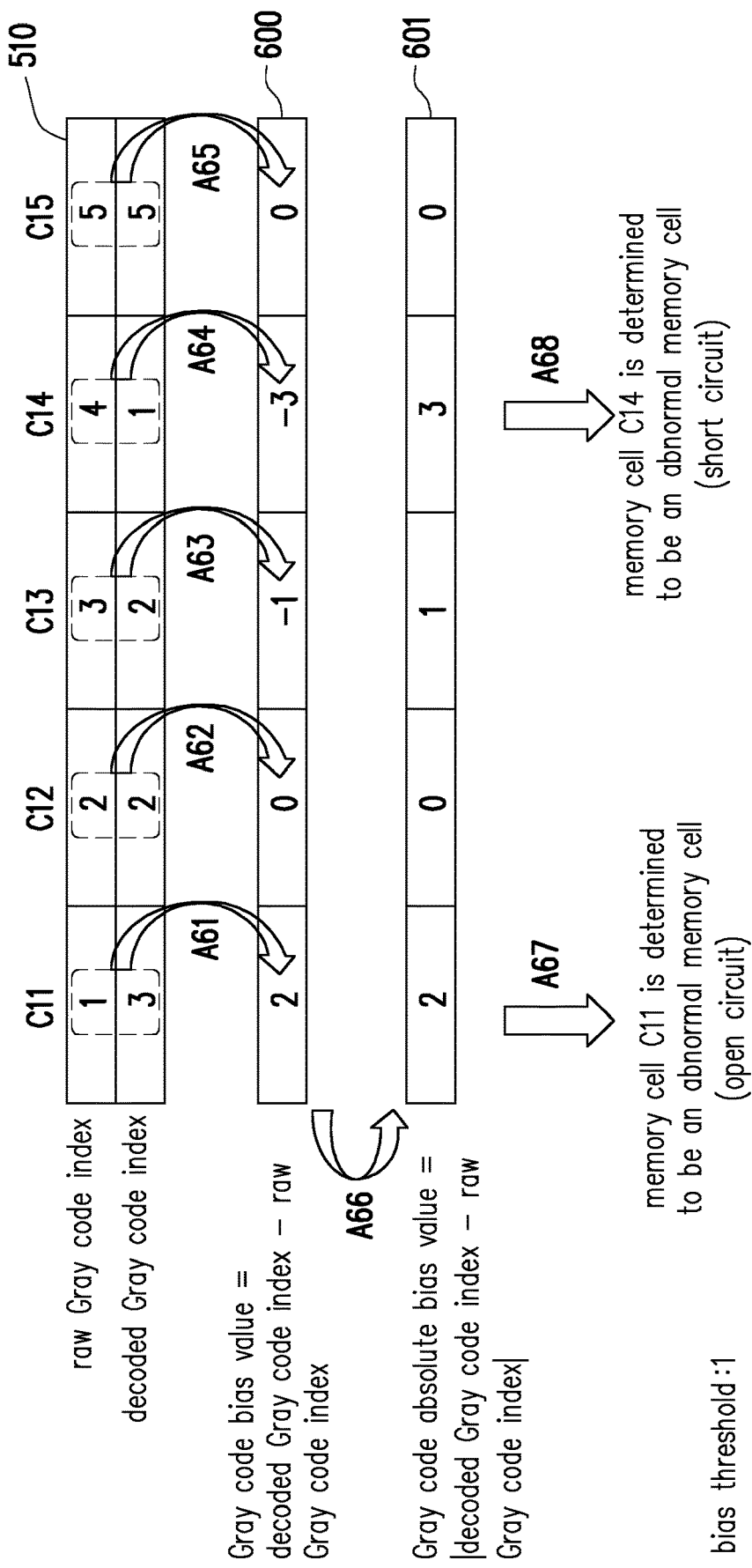
FIG. 6A is a schematic view showing how to calculate Gray code absolute bias values according to an embodiment of the disclosure.

FIG. 6A is a schematic view showing how to calculate Gray code absolute bias values according to an embodiment of the disclosure. With reference to FIG. 6A, following the example of FIG. 5, after the plurality of raw Gray code indexes "1", "2", "3", "4" and "5" corresponding to the memory cells C11-C15 and the plurality of decoded Gray code indexes "3", "2", "2", "1" and "5" corresponding to the memory cells C11-C15 are identified, the word-line management circuit unit 215 (or the Gray code bias detection circuit 2151) calculates difference values regarding the memory cells C11-C15 respectively, i.e., the Gray code bias values (as shown by arrows A61-A65). The obtained Gray code bias values of the memory cells C11-C15 are "2", "0", "−1", "−3" and "0" (as shown in Table 600). The word-line management circuit unit 215 (or the Gray code bias detection circuit 2151) further calculates (as shown by arrow A66) that the absolute values of the Gray code bias values (i.e., the Gray code absolute bias values) are "2", "0", "1", "3" and "0" (as shown in Table 601).

With reference to FIG. 2 again, after the plurality of Gray code absolute bias values of the memory cells are obtained, step S27 is then executed, in which the word-line management circuit unit 215 (or the abnormality management circuit 2152) identifies one or more abnormal memory cells among the memory cells according to the Gray code absolute bias values, and records the one or more abnormal memory cells into an abnormal memory cell table. Herein a Gray code absolute bias value of each of the one or more abnormal memory cells is greater than a bias threshold.

For example, with reference to FIG. 6A again, if the bias threshold is 1, the word-line management circuit unit 215 (or the abnormality management circuit 2152) then determines whether the memory cells are abnormal memory cells according to the obtained Gray code absolute bias values. Specifically, in response to the fact that the Gray code absolute bias value greater than the bias threshold, the word-line management circuit unit 215 (or the abnormality management circuit 2152) then determines that the memory cell corresponding to the Gray code absolute bias value is an abnormal memory cell. As shown by arrow A67, in the case where the bias threshold is 1 and the Gray code absolute bias value of the memory cell C11 is "2" that is greater than 1, the word-line management circuit unit 215 (or the abnormality management circuit 2152) then determines that the memory cell C11 is an abnormal memory cell. As shown by arrow A68, in the case where the bias threshold is 1 and the Gray code absolute bias value of the memory cell C14 is "3" which is greater than 1, the word-line management circuit unit 215 (or the abnormality management circuit 2152) then determines that the memory cell C14 is an abnormal memory cell.

It should be noted that, in this embodiment, the abnormality management circuit 2152 may further determine whether one memory cell has an open circuit phenomenon by comparing the Gray code bias value of the one memory cell with an open circuit bias threshold; and may determine whether one memory cell has a short circuit phenomenon by comparing the Gray code bias value of the one memory cell with a short circuit bias threshold. The open circuit bias threshold is, for example, a positive integer: 1. The short circuit bias threshold is, for example, a negative number: −1.

For example, it is assumed that the Gray code bias value of one memory cell is positive. The abnormality management circuit 2151 may further compare the Gray code bias value with the open circuit bias threshold. In response to the fact that the Gray code bias value of the one memory cell that is greater than the open circuit bias threshold, the abnormality management circuit 2151 then determines that the one memory cell has an open circuit phenomenon (e.g., the memory cell C11 illustrated in FIG. 6A). For another example, it is assumed that the Gray code bias value of one memory cell is negative. The abnormality management circuit 2151 may further compare the Gray code bias value with the short circuit bias threshold. In response to the fact that the Gray code bias value of the one memory cell that is less than the short circuit bias threshold, the abnormality management circuit 2151 then determines that the one memory cell has a short circuit phenomenon (e.g., the memory cell C14 illustrated in FIG. 6A).

After the memory cells C11 and C14 are determined to be abnormal memory cells, the word-line management circuit unit 215 (or the abnormality management circuit 2152) may use the abnormal memory cell table to record that the memory cells C11 and C14 of the target word-line WL1 are abnormal memory cells. FIG. 6B is a schematic view showing an abnormal memory cell table according to an embodiment of the disclosure.

With reference to FIG. 6B, for example, in this embodiment, an abnormal memory cell table 610 includes a first field and a second field. The first field records the location of the abnormal memory cell of the corresponding word-line, and the second field records the total number of the abnormal memory cells of the corresponding word-line. The entries for each field are arranged in the order of all of the word-line indexes (e.g., WL1-WLN) of the rewritable non-volatile memory module 220. Following the example of FIG. 6A, the word-line management circuit unit 215 (or the abnormality management circuit 2152) records "1, 4" into the first field (the location of the abnormal memory cell) corresponding to the word-line WL1 to show that the first memory cell C11 and the fourth memory cell C14 of the word-line WL1 are abnormal memory cells and, at the same time, records the corresponding value (i.e., 2) into the second field (the total number of the abnormal memory cells) according to the total number of the abnormal memory cells of the word-line WL1. When the storage device 20 is in operation, the abnormal memory cell table 610 is maintained in the buffer memory 216, and is backed up to the rewritable non-volatile memory module 220 at an appropriate timing. It should be noted that the disclosure does not impose any limitations on the format of the abnormal memory cell table. For example, the abnormal memory cell table may not have the second field, or the plurality of entries in the first field of the abnormal memory cell table may not be arranged according to the order of the word-line indexes. In addition, in response to the determination that a plurality of the memory cells of a word-line are non-abnormal memory cells, the word-line management circuit unit 215 (or the abnormality management circuit 2152) may record "0" into the first field to indicate that the word-line does not have any abnormal memory cell. It should be noted that if the word-line verification operation has not been performed on a word-line, the entries corresponding to the word-line in the first field and the second field of the abnormal memory cell table are null values (NULL), i.e., no values are recorded (or specific values preset to correspond to null values are recorded). The following should be noted here: in another embodiment, the word-line management circuit unit 215 (or the abnormality management circuit 2152) may further record the abnormal memory cell into the abnormal memory cell table according to whether the abnormal memory cell has a short circuit phenomenon or an open circuit phenomenon, so that the processor 211 may know which memory cell in the rewritable non-volatile memory module 220 has the short circuit phenomenon or the open circuit phenomenon.

In this embodiment, the abnormal memory cell table may also be applied to the executed decoding operation, which is described with reference to FIG. 7 hereinafter.

Figure 7:
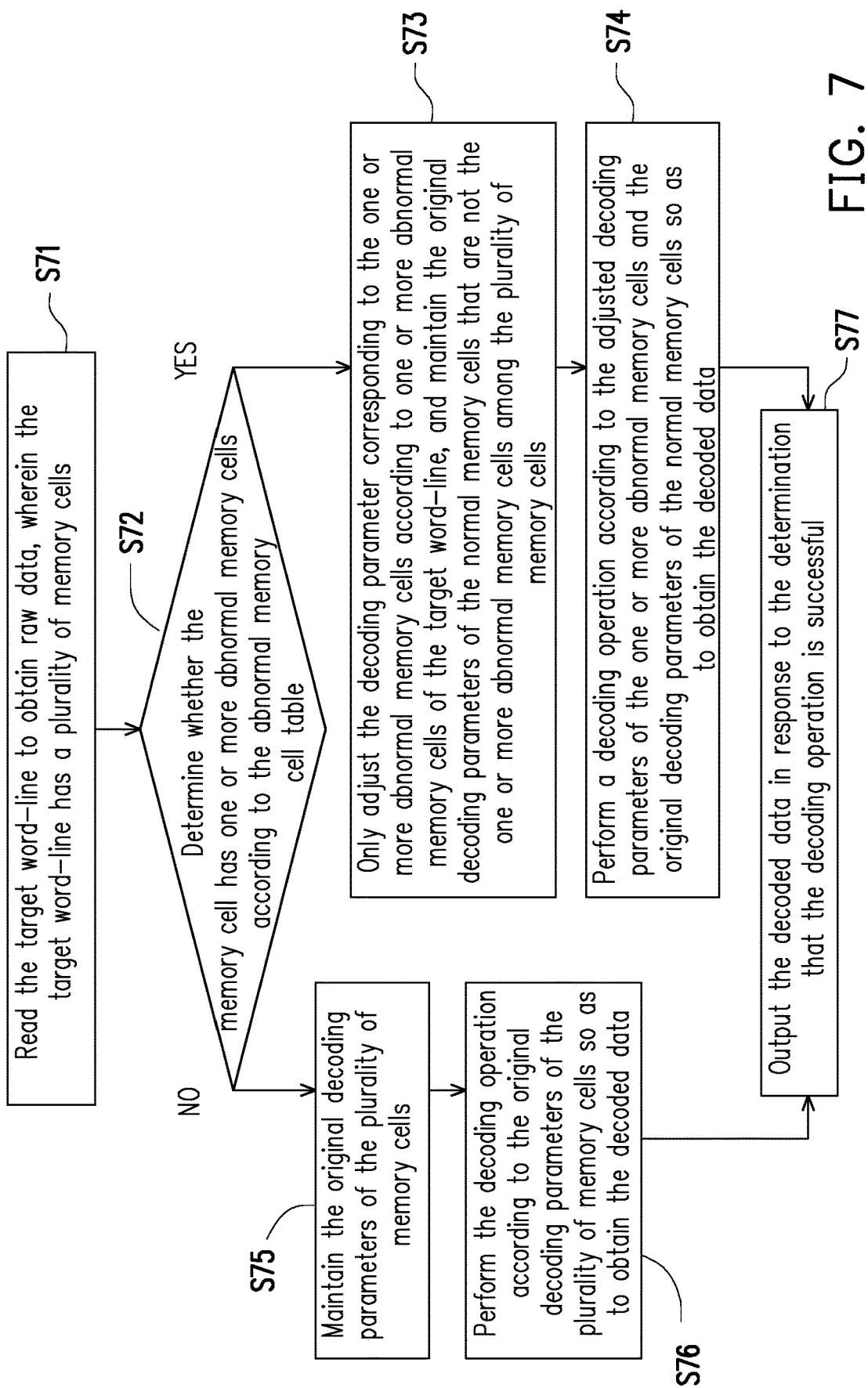
FIG. 7 is a flowchart showing a decoding method according to an embodiment of the disclosure.

FIG. 7 is a flowchart showing a decoding method according to an embodiment of the disclosure. With reference to FIG. 7, in step S71, the processor 211 instructs the memory interface control circuit 213 to read the target word-line to obtain raw data. Herein the target word-line has a plurality of memory cells.

Next, in step S72, the word-line management circuit unit 215 (or the abnormality management circuit 2152) determines whether the memory cell has one or more abnormal memory cells according to the abnormal memory cell table. Specifically, the word-line management circuit unit 215 (or the abnormality management circuit 2152) determines whether to correspondingly adjust the decoding operation to be performed on the raw data according to the recorded abnormal memory cell table.

In response to the determination that the target word-line has an abnormal memory cell, step S73 is then executed, in which the error checking and correcting circuit 214, according to one or more abnormal memory cells of the target word-line, only adjusts the decoding parameter corresponding to the one or more abnormal memory cells, and maintains the original decoding parameters of the normal memory cells that are not the one or more abnormal memory cells among the plurality of memory cells.

The decoding parameter is a parameter changed or set corresponding to the memory cell of the read word-line during the decoding operation, and the decoding parameter corresponds to a decoding algorithm that is used in the decoding operation.

For example, in this embodiment, the error checking and correcting circuit 214 uses a low density parity code (LDPC) algorithm. The decoding process of the LDPC may be represented as a belief propagation graph. The belief propagation graph includes a plurality of check nodes and a plurality of variable nodes. Each check node corresponds to a syndrome, and each variable node corresponds to a bit value (also known as a data bit) in the codeword currently to be decoded. The correspondence between the data bit and the syndrome (i.e., the connection relationship between the plurality of variable nodes and the plurality of check nodes) is generated based on a parity check matrix adopted by the low density parity check code.

When the processor 211 reads n data bits (forming a codeword) from the rewritable non-volatile memory module 220, the error checking and correcting circuit 214 also obtains channel reliability information for each data bit. The channel reliability information is used to represent the probability (or referred to as confidence) that the corresponding data bit is decoded as bit "1" or bit "0". For example, in the belief propagation graph, each of the plurality of variable nodes receives a plurality of corresponding channel reliability information. The error checking and correcting circuit 214 performs a decoding operation according to the structure of the belief propagation graph and the plurality of channel reliability information. In this embodiment, the decoding parameter corresponding to the LDPC algorithm is none other than the channel reliability information corresponding to the bit value stored in each memory cell.

The channel reliability information is represented by a log likelihood ratio (LLR). The log-likelihood ratio is commonly used in various algorithms for LDPC circuits, such as the sum-product algorithm (SPA), the min-sum algorithm, or the bit-flipping algorithm, the log-likelihood ratio (LLR) algorithm, the offset min-sum algorithm, etc. Since these algorithms have already been known by those skilled in the art, descriptions thereof are not repeated hereinafter.

In this embodiment, iteration in the iterative decoding operation is continuously and repeatedly executed to update (or optimize) the channel reliability information corresponding to at least some of the data bits. Accordingly, the channel reliability information actually used to decode the data bits may be updated in any of the iterations. If the codeword generated by one certain iteration in the decoding operation is a valid codeword, the decoding is successful, and the decoding operation is then stopped. If the generated codeword is not a valid codeword, the next iteration is then performed.

In the related field, the log-likelihood ratio is an input parameter of the decoded LDPC for decoding the data through the LDPC circuit. Besides, in the related field, methods of updating the log-likelihood ratio include optimization methods such as hill climbing, simulated annealing and gradient descent. However, as described above, the error checking and correcting circuit 214 additionally adjusts/changes the channel reliability information (the log-likelihood ratio) corresponding to the abnormal memory cell in the target word-line according to the abnormal memory cell table.

Since a plurality of log-likelihood ratios used in the iterative decoding operation are changed, it is possible to change the decoding result of the decoding operation so as to correct back (or to decode successfully) the error bit. The above-described operation of changing the values of the plurality of log-likelihood ratios used in the iterative decoding operation may also be referred to as a perturbation operation.

In other words, after identifying one or more abnormal memory cells of the target word-line, the word-line management circuit unit 215 (or the abnormality management circuit 2152) transmits the location of the one or more abnormal memory cells to the error checking and correcting circuit 214, and the error checking and correcting circuit 214 sets the value corresponding to the log-likelihood ratio of the one or more abnormal memory cells to 0, or to an opposite value (e.g., −1) that is opposite to the original log-likelihood ratio (e.g., 1). It should be noted that the log-likelihood ratio originally calculated by the normal memory cell that is not an abnormal memory cell is not to be adjusted (changed).

Then, after the decoding parameters are adjusted, the error checking and correcting circuit 214 performs a decoding operation according to the adjusted decoding parameters of the one or more abnormal memory cells and the original decoding parameters of the normal memory cells so as to obtain the decoded data. That is, in this embodiment, the error checking and correcting circuit 214 starts to perform a (iterative) decoding operation after the log-likelihood ratios of the abnormal memory cell are adjusted.

Next, in step S77, in response to the determination that the decoding operation is successful, the error checking and correcting circuit 214 outputs the decoded data. On the contrary, in response to the determination that the decoding operation is unsuccessful (failure), the error checking and correcting circuit 214 may execute step S73 and step S74 again and perform the decoding operation again in an attempt to obtain the correct decoded data.

Besides, in another embodiment, the result of the decoding operation may also be changed by directly flipping the data bit stored in the abnormal memory cell (such as using the bit-flipping algorithm) and re-performing the decoding operation on the flipped codeword. Under some circumstances, codewords that may not be decoded before flipping (codewords that have uncorrectable error bits) may be successfully decoded after flipping (the uncorrectable error bits are successfully corrected).

In response to the determination that the target word-line does not have an abnormal memory cell, step S75 is then executed, in which the error checking and correcting circuit 214 maintains the original decoding parameters of the plurality of memory cells. That is, in response to the determination that the target word-line does not have an abnormal memory cell, the word-line management circuit unit 215 (or the abnormality management circuit 2152) notifies the error checking and correcting circuit 214 not to adjust the original log-likelihood ratios of all of the memory cells of the target word-line. Next, in step S76, the error checking and correcting circuit 214 performs a decoding operation according to the original decoding parameters of the plurality of memory cells so as to obtain the decoded data. Then, in response to the determination that the decoding operation is successful (step S77), the decoded data is output. On the contrary, if it is determined that the decoding operation is unsuccessful (failure), the error checking and correcting circuit 214 may perform the iterative decoding operation again according to the previous decoding result, and continue to check whether the decoding is successful.

It should be noted that if the word-line management circuit unit 215 (or the abnormality management circuit 2152) in step S72 determines that the abnormal memory cell table does not contain a record corresponding to the target word-line, step S75 is then executed.

The following should be noted here: in one embodiment, in order to identify a bad word-line, the word-line management circuit unit 215 (or the abnormality management circuit 2152) uses the abnormal memory cell table to determine whether or not to mark the word-line as a bad word-line according to the total number of abnormal memory cells in one word-line.

Figure 8:
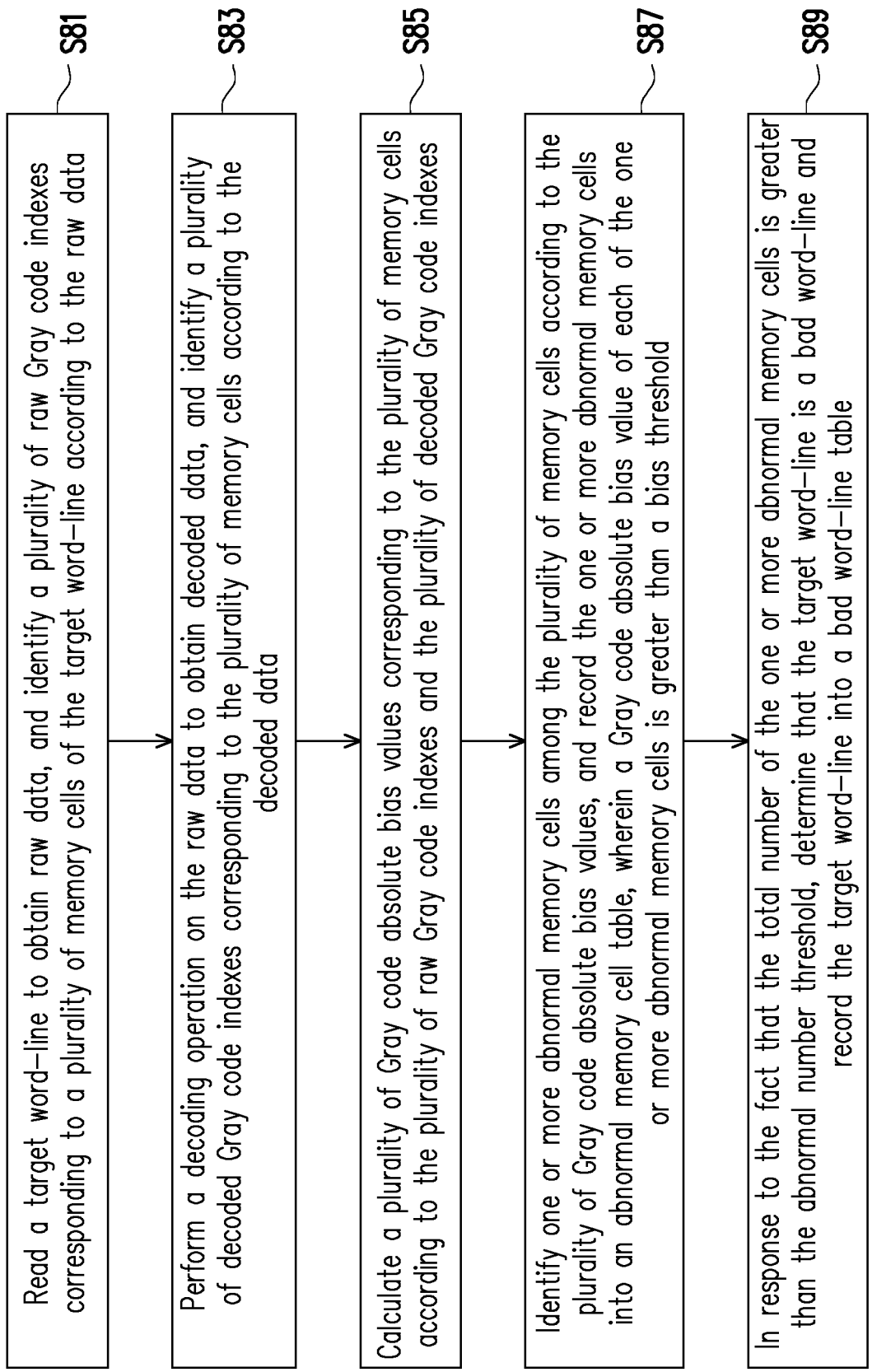
FIG. 8 is a flowchart showing a memory management method according to an embodiment of the disclosure.

FIG. 8 is a flowchart showing a memory management method according to an embodiment of the disclosure. Step S81 to step S87 are similar to step S21 to step S27 in FIG. 2, so details thereof are not repeated hereinafter. In step S89, in response to the total number of the one or more abnormal memory cells is greater than the abnormal number threshold, the word-line management circuit unit 215 (or the abnormality management circuit 2152) determines that the target word-line is a bad word-line, and records the target word-line into a bad word-line table. Specifically, after the word-line verification operation on the target word-line is completed to identify one or more abnormal memory cells of the target word-line, when the total number of the one or more abnormal memory cells as identified is greater than the abnormal number threshold, the word-line management circuit unit 215 (or the abnormality management circuit 2152) further determines that the target word-line is a bad word-line, and records the word-line index of the target word-line into the bad word-line table, or changes the value recorded in the entry of the corresponding target word-line in the bad word-line table from a preset first value for indicating a normal status into a second value for indicating an abnormal status. The bad word-line is a word-line no longer suitable for storing data.

For example, when the writing operation is executed, if the corresponding write data is to be written into the target word-line, the processor 211 may determine whether the word-line is marked as a bad word-line according to the bad word-line table. Specifically, the processor 211 may further check whether the target word-line is a bad word-line according to the bad word-line table. If it is determined that the target word-line is marked as the bad word-line, the processor 211 then selects another word-line as the word-line for storing the write data.

On the contrary, if the processor 211 determines that the target word-line is not marked as the bad word-line, the processor 211 then directly executes a write command to write the write data into the target word-line. In this way, before executing a writing operation to write a write data into the target word-line, the processor 211 may determine whether the target word-line is marked as the bad word-line first so as to write the write data.

It should be noted that in response to the fact that the total number of the bad word-lines in one physical block is greater than a bad word-line threshold, the processor 211 may determine that the physical block is a bad physical block. Then, the processor 211 may perform a bad physical block management operation on the bad physical block (such as marking the bad physical block into a bad block table, and moving the valid data in the bad physical block into other physical blocks).

In summary, in the memory management method and the storage controller provided by the embodiments of the disclosure, the word-line verification operation is performed on the rewritable non-volatile memory module of the storage device, so that the corresponding Gray code absolute bias values are obtained according to the raw bit values and the decoded bit values of the memory cells of the target word-line as read, and whether the target word-line has an abnormal memory cell or not is determined according to the plurality of Gray code absolute bias values. In this way, it is possible to effectively and precisely determine whether each memory cell of the word-lines of the rewritable non-volatile memory module is an abnormal memory cell, and to record the location of the abnormal memory cell. Accordingly, the storage controller may reduce the negative effects caused by the abnormal memory cells in the rewritable non-volatile memory module of the storage device and improve the efficiency of the decoding operation, or, the storage controller may avoid using the word-line having too many abnormal memory cells so as to improve the reliability of the data stored by the storage device.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of this disclosure. In view of the foregoing, it is intended that the disclosure covers modifications and variations provided that they fall within the scope of the following claims and their equivalents.

What is claimed is:

1. A memory management method adapted for a rewritable non-volatile memory module, wherein the rewritable non-volatile memory module has a plurality of word-lines, and each of the plurality of word-lines is composed of a plurality of memory cells, wherein each of the plurality of memory cells is configured to be programmed to store a bit value corresponding to one of a plurality of different Gray codes, the memory management method comprising:
    reading the target word-line to obtain raw data, wherein the target word-line has a plurality of memory cells;
    determining whether the memory cell has one or more abnormal memory cells according to the abnormal memory cell table;
    in response to determining that the memory cell has the one or more abnormal memory cells, only adjusting the decoding parameter corresponding to the one or more abnormal memory cells according to one or more abnormal memory cells of the target word-line, and maintaining the original decoding parameters of the normal memory cells that are not the one or more abnormal memory cells among the plurality of memory cells; and
    performing a decoding operation according to the adjusted decoding parameters of the one or more abnormal memory cells and the original decoding parameters of the normal memory cells, so as to obtain the decoded data.

2. The memory management method according to claim 1, further comprising:
    in response to determining that the memory cell does not have the one or more abnormal memory cells, not adjusting the original decoding parameters of the plurality of memory cells; and
    performing the decoding operation according to the original decoding parameters of the plurality of memory cells, so as to obtain the decoded data.

3. The memory management method according to claim 2, further comprising:
    in response to determining that the decoding operation is successful, outputting the decoded data.

4. The memory management method according to claim 1, wherein
    the abnormal memory cell table records a plurality of entries respectively corresponding to the word-lines, wherein each of the entries comprises a plurality of fields,
    wherein each of the fields comprises:
        a first field, configured to record an abnormal memory cell location; and
        a second field, configured to record an abnormal memory cell total number.

5. The memory management method according to claim 4, further comprising:
    according to a target word-line index of the target word-line, determining whether the target word-line has the one or more abnormal memory cells by a target entry corresponding to the target word-line index in the abnormal memory cell table;
    according to the first field of the target entry, identifying the abnormal memory cell location of each of the one or more abnormal memory cells in the target word-line.

6. A memory management method adapted for a rewritable non-volatile memory module, wherein the rewritable non-volatile memory module has a plurality of word-lines, and each of the plurality of word-lines is composed of a plurality of memory cells, wherein each of the plurality of memory cells is configured to be programmed to store a bit value corresponding to one of a plurality of different Gray codes, the memory management method comprising:

reading a target word-line to obtain raw data, and identify a plurality of raw Gray code indexes corresponding to a plurality of memory cells of the target word-line according to the raw data;

performing a decoding operation on the raw data to obtain decoded data, and identify a plurality of decoded Gray code indexes corresponding to the plurality of memory cells according to the decoded data;

calculating a plurality of Gray code absolute bias values corresponding to the plurality of memory cells according to the plurality of raw Gray code indexes and the plurality of decoded Gray code indexes;

identifying one or more abnormal memory cells among the plurality of memory cells according to the plurality of Gray code absolute bias values, and recording the one or more abnormal memory cells into an abnormal memory cell table, wherein a Gray code absolute bias value of each of the one or more abnormal memory cells is greater than a bias threshold;

in response to the fact that the total number of the one or more abnormal memory cells is greater than the abnormal number threshold, determining that the target word-line is a bad word-line, and recording the target word-line into a bad word-line table or marking the target word-line as the bad word-line.

7. The memory management method according to claim 6, wherein the abnormal memory cell table records a plurality of entries respectively corresponding to the word-lines, wherein each of the entries comprises a plurality of fields, wherein each of the fields comprises:

a first field, configured to record an abnormal memory cell location; and a second field, configured to record an abnormal memory cell total number.

8. The memory management method according to claim 6, further comprising:

in response to the fact that the total number of the bad word-lines in one physical block is greater than a bad word-line threshold, determining that the said one physical block is a bad block.

9. A storage controller configured to control a storage device having a rewritable non-volatile memory module, wherein the rewritable non-volatile memory module has a plurality of word-lines, and each of the plurality of word-lines is composed of a plurality of memory cells, wherein each of the plurality of memory cells is configured to be programmed to store a bit value corresponding to one of a plurality of different Gray codes, the storage controller comprising:

a connection interface circuit configured to be coupled to a host system;

a memory interface control circuit configured to be coupled to the rewritable non-volatile memory module;

an error checking and correcting circuit configured to perform a decoding operation;

a word-line management circuit unit; and a processor coupled to the connection interface circuit, the memory interface control circuit, the error checking and correcting circuit and the word-line management circuit unit, wherein the processor is configured to instruct the memory interface control circuit to read the target word-line to obtain raw data, wherein the target word-line has a plurality of memory cells, wherein the word-line management circuit unit is configured to determine whether the memory cell has one or more abnormal memory cells according to the abnormal memory cell table, in response to determining that the memory cell has the one or more abnormal memory cells by the word-line management circuit unit, the error checking and correcting circuit is further configured to only adjust the decoding parameter corresponding to the one or more abnormal memory cells according to one or more abnormal memory cells of the target word-line, and maintain the original decoding parameters of the normal memory cells that are not the one or more abnormal memory cells among the plurality of memory cells, wherein the error checking and correcting circuit is further configured to perform a decoding operation according to the adjusted decoding parameters of the one or more abnormal memory cells and the original decoding parameters of the normal memory cells, so as to obtain the decoded data.

10. The storage controller according to claim 9, wherein in response to determining that the memory cell does not have the one or more abnormal memory cells, the error checking and correcting circuit does not adjust the original decoding parameters of the plurality of memory cells, wherein the error checking and correcting circuit performs the decoding operation according to the original decoding parameters of the plurality of memory cells, so as to obtain the decoded data.

11. The storage controller according to claim 10, wherein in response to determining that the decoding operation is successful, the error checking and correcting circuit outputs the decoded data.

12. The storage controller according to claim 9, wherein the abnormal memory cell table records a plurality of entries respectively corresponding to the word-lines, wherein each of the entries comprises a plurality of fields, wherein each of the fields comprises:

a first field, configured to record an abnormal memory cell location; and a second field, configured to record an abnormal memory cell total number.

13. The storage controller according to claim 12, wherein according to a target word-line index of the target word-line, the word-line management circuit unit determines whether the target word-line has the one or more abnormal memory cells by a target entry corresponding to the target word-line index in the abnormal memory cell table, wherein, according to the first field of the target entry, the word-line management circuit unit identifies the abnormal memory cell location of each of the one or more abnormal memory cells in the target word-line.

14. A storage controller configured to control a storage device having a rewritable non-volatile memory module, wherein the rewritable non-volatile memory module has a plurality of word-lines, and each of the plurality of word-lines is composed of a plurality of memory cells, wherein each of the plurality of memory cells is configured to be programmed to store a bit value corresponding to one of a plurality of different Gray codes, the storage controller comprising:

a connection interface circuit configured to be coupled to a host system;

a memory interface control circuit configured to be coupled to the rewritable non-volatile memory module;

an error checking and correcting circuit configured to perform a decoding operation;

a word-line management circuit unit; and a processor coupled to the connection interface circuit, the memory interface control circuit, the error checking and correcting circuit and the word-line management circuit unit, wherein the processor is configured to instruct the memory interface control circuit to read a target word-line to obtain raw data, wherein the word-line management circuit unit is configured to identify a plurality of raw Gray code indexes corresponding to a plurality of memory cells of the target word-line according to the raw data, wherein the processor is further configured to instruct the error checking and correcting circuit to perform a decoding operation on the raw data to obtain decoded data, wherein the word-line management circuit unit is further configured to identify a plurality of decoded Gray code indexes corresponding to the plurality of memory cells according to the decoded data, wherein the word-line management circuit unit is further configured to calculate a plurality of Gray code absolute bias values corresponding to the plurality of memory cells according to the plurality of raw Gray code indexes and the plurality of decoded Gray code indexes, wherein the word-line management circuit unit is further configured to identify one or more abnormal memory cells among the plurality of memory cells according to the plurality of Gray code absolute bias values, and record the one or more abnormal memory cells into an abnormal memory cell table, wherein a Gray code absolute bias value of each of the one or more abnormal memory cells is greater than a bias threshold, wherein, in response to the fact that the total number of the one or more abnormal memory cells is greater than the abnormal number threshold, the word-line management circuit unit is further configured to determine that the target word-line is a bad word-line, and record the target word-line into a bad word-line table or mark the target word-line as the bad word-line.

15. The storage controller according to claim 14, wherein the abnormal memory cell table records a plurality of entries respectively corresponding to the word-lines, wherein each of the entries comprises a plurality of fields, wherein each of the fields comprises:

a first field, configured to record an abnormal memory cell location; and a second field, configured to record an abnormal memory cell total number.

16. The storage controller according to claim 14, further comprising:

in response to the fact that the total number of the bad word-lines in one physical block is greater than a bad word-line threshold, the processor determines that the said one physical block is a bad block.

* * * * *